United States Patent [19]

Clements et al.

[11] Patent Number: 4,868,637

[45] Date of Patent: * Sep. 19, 1989

[54] ELECTRONIC DEVICE INCLUDING UNIAXIAL CONDUCTIVE ADHESIVE AND METHOD OF MAKING SAME

[76] Inventors: James R. Clements, 5840 Darbwood La., West Bloomfield, Mich. 48033; Terry T. J. Yu; Laura H. C. Yu, both of 19832 White Oaks Dr., Mt. Clemens, Mich. 48043

[*] Notice: The portion of the term of this patent subsequent to Jan. 19, 2005 has been disclaimed.

[21] Appl. No.: 105,999

[22] Filed: Oct. 5, 1987

Related U.S. Application Data

[60] Continuation of Ser. No. 943,499, Dec. 19, 1986, which is a division of Ser. No. 801,745, Nov. 26, 1985, Pat. No. 4,667,401.

[51] Int. Cl.⁴ .......................................... H01L 23/28
[52] U.S. Cl. ........................................ 357/72; 357/67; 357/65; 357/70; 174/88 R
[58] Field of Search ................. 357/72; 174/88 R; 427/103; 252/511

[56] References Cited

U.S. PATENT DOCUMENTS

| | | | |
|---|---|---|---|
| 4,001,655 | 1/1977 | Voyles et al. | 357/72 |
| 4,039,904 | 8/1977 | Klein et al. | 357/72 |
| 4,113,981 | 9/1978 | Fujita et al. | 174/88 R |
| 4,145,317 | 3/1979 | Sado et al. | 252/511 |
| 4,419,279 | 12/1983 | Abrams | 252/511 |
| 4,522,888 | 6/1985 | Eichelberger et al. | 427/103 |
| 4,640,981 | 2/1987 | Dery et al. | 174/88 R |
| 4,720,740 | 1/1988 | Clements et al. | 357/72 |

Primary Examiner—Rolf Hille
Assistant Examiner—Hoan Ganh Le
Attorney, Agent, or Firm—Reising, Ethington, Barnard, Perry & Milton

[57] ABSTRACT

An electronic device made by the method of connecting a circuit member (18) having a plurality of laterally spaced electrically conductive terminals (20) to a substrate (12) including a mounting surface (14) having a plurality of laterally spaced conductive paths (16) wherein the method includes the steps of applying an adhesive (22) including a resin having a twenty to twenty-five percent by weight content of conductive metal particles over the mounting surface (14) of the substrate (12) having the conductive paths (16) wherein the resin is a dielectric preventing conductivity between the spaced metal particles therein and mounting the circuit member (18) on the adhesive (22) while vertically aligning the conductive terminals (20) over preselected ones of the conductive paths (16). The percent by weight content of the conductive metal particles in the adhesive (22) is concentrated between each conductive terminal (20) and the vertically aligned conductive paths (16) to between forty to fifty percent by weight to decrease the spacing between the metal particles allowing conductivity through the resin and making the resin uniaxially conductive vertically aligned between the conductive terminal (20) and conductive path (16) while the resin unconcentrated adhesive (22) remains nonconductive between laterally spaced terminals (20) and conductive paths (16).

6 Claims, 3 Drawing Sheets

ELECTRONIC DEVICE INCLUDING UNIAXIAL CONDUCTIVE ADHESIVE AND METHOD OF MAKING SAME

This application is a continuation of application Ser. No. 943,499, filed 12/19/86 which is a divisional of U.S. Ser. No. 801,745, filed 11/26/85; now U.S. Pat. No. 4,667,401, issued 5/26/87.

TECHNICAL FIELD

The subject invention relates to and electronic device and an electrically conductive adhesive therefor. The invention further relates to a method of connecting a circuit member having a plurality of laterally spaced conductive terminals to a substrate including a surface having a plurality of laterally spaced conductive paths utilizing the adhesive.

BACKGROUND ART

In many electrical applications, it is desirable to connect an electrical component having a plurality of conductive terminals to a substrate including a plurality of laterally spaced conductive paths such that the conductive terminals are aligned with the conductive paths in a predetermined pattern. For proper function, current is passed from the aligned conductive terminal to the substrate path, or visa a verse. It is undesirable for current to pass between laterally spaced terminals or conductive pad, such conductivity causing shorting of the circuit. This desired function is referred to as uniaxial conductivity.

Conventional methods of connecting the conductive terminals to the substrate generally include soldering techniques. Soldering requires dot deposition; that is, application of the solder only on the terminals and not therebetween. Soldering further requires specific temperature resistant components and substrates. Such materials must withstand the 400° F. and greater temperatures generally encountered in the solder application.

The U.S. Pat. No. 4,113,981 to Fujita et al, issued Sept. 12, 1978, discloses an electrically conductive adhesive for connecting arrays of conductors. The adhesive includes a nonconductive base and electrically conductive particles incorporated into the base. The patent requires that the particles are not in contact with one another. The adhesive provides conductivity in one direction between two facing members but does not provide electric conductivity in the lateral direction. The Fujita et al patent requires a mixing ratio of between thirty to sixty percent by volume of conductive particles in the adhesive base. When the proportion of the conductive particles is less than thirty percent by volume, the value of the electrical resistance in the lateral direction begins to be lowered and, when the amount of conductive particles is about sixty percent by volume, a substantial conductivity is manifested in the lateral direction. The patent states that it is preferred that the mixing ratio of the conductive particles be lower than about thirty percent by volume. Additionally, the patent states that the mixing ratio is determined within the above range so that at least one electrically conductive particle is present between opposed facing members to be electrically connected with each other. In practice, such metal particles are chosen to be within the range of approximately 8 to 10 microns. This method therefor requires that the terminal members be brought to within 8 to 10 microns of the substrate paths in order to provide for connection between the terminal member, the electrical particle, and the conductive paths. Such practice requires clean room techniques because in such a microscopic size range, dust particle contamination must be prevented. Therefore, the Fujita et al patent is dependent upon the concept that the space in between the conductive elements must be the same size as the largest of the conductive particles in the adhesive and that the conductive particles in the adhesive must be substantially the same size and shape. Consequently, there is a need for a uniaxially conductive adhesive not requiring the close tolerances or clean room limitations of prior art adhesives.

It has been reported that the conductivity of an adhesive resin having a conductive metal mixed therein is dependent upon the concentration of method in the adhesive. Polymer Science Technology, Vol. 15, Plenum Press (1981). The instant invention applies this concept to derive a uniaxial conductive adhesive.

STATEMENT OF THE INVENTION

According to the present invention, there is provided a method of connecting an electronic circuit member having a plurality of laterally spaced electrically conductive terminals to a substrate including a surface having a plurality of laterally spaced conductive paths, the method including the steps of applying an adhesive including a resin having a twenty to twenty-five percent by weight content of conductive metal particles over the surface of the substrate having the conductive paths, the resin being a dielectric preventing conductivity between the spaced metal particles in the adhesive, and mounting the circuit member on the adhesive while vertically aligning the conductive terminals over preselected ones of the conductive paths. The invention is characterized by the step of concentrating the percent by weight content of the conductive metal particles in the adhesive between each conductive terminal and the vertically aligned conductive path to between forty to fifty percent by weight to decrease the spacing beteen the metal particles allowing conductivity through the resin and making the resin conductive vertically between the conductive terminals and paths while the adhesive resin in the unconcentrated adhesive remains nonconductive between laterally spaced terminals and conductive paths.

The instant invention further provides an electric device including the substrate, the circuit member, and the adhesive disposed over the mounting surface of the substrate. The adhesive includes the dielectric a resin having about forty to fifty percent by weight conductive metal particles between the vertically aligned terminals and the conductive paths and is uniaxially conductive vertically therebetween. The resin includes twenty to twenty-five percent by weight conductive metal between laterally spaced terminals and conductive paths and the resin is nonconductive laterally therebetween.

FIGURES IN THE DRAWINGS

Other advantages of the present invention will be readily appreciated as the same becomes better understood by reference to the following detailed description when considered in connection with the accompanying drawings wherein.

DETAILED DESCRIPTION OF THE DRAWINGS

Figure 1:
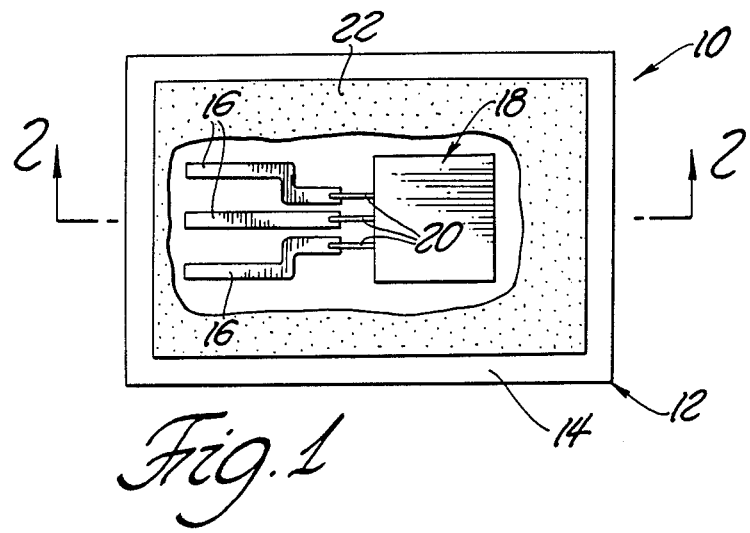
FIG. 1 is a plan view of a circuit member mounted upon a substrate.
Figure 2:
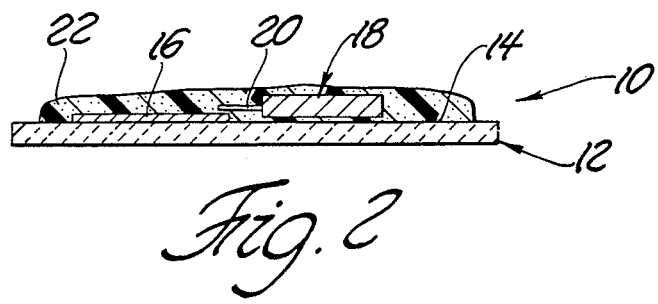
FIG. 2 is a cross sectional view taken substantially along lines 2—2 of FIG. 1.
Figure 3:
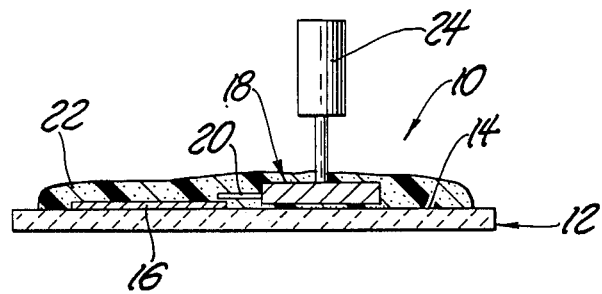
FIG. 3 is cross sectional view of the circuit member mounted on a substrate and means for applying pressure to the circuit member against the substrate.

An electrical device constructed in accordance with the instant invention is generally shown at 10 in FIGS. 1-3. The device includes a substrate is generally indicated at 12. The substrate is a supporting material on or in which parts of a circuit are attached or made. A substrate may be passive or active.

The substrate includes a mounting surface 14 having a plurality of laterally spaced conductive paths 16 thereon. Such a substrate is generally referred to as printed circuit in which normally found interconnecting wires are replaced by conductive strips 16 printed, etched, or otherwise mounted onto the insulating substrate 12. In other words, the substrate is nonconductive, providing insulation between the conductive paths 16. The substrate 12 may also be referred to as printed circuit board or insulating board onto which the conductive paths 16 or circuit are printed.

A circuit member is generally indicated at 18. The circuit member 18 may be in the form of any one of various types of electrical components, such as capacitors, resistors etc. or may be in the form of other semiconductors. Alternatively, circuit member 18 may be a second substrate mounted upon a first substrate 12.

The circuit member 18 includes a plurality of laterally spaced conductive terminals 20 aligned vertically over selected ones of the conductive paths 16. Functionally it is desirable to have uniaxial electrical conductivity to or from the conductive paths 16 to the conductive terminals 20, without electrical conductivity between laterally spaced conductive paths 16 or conductive terminals 20.

An adhesive coating 22 is disposed over the mounting surface 14 for adhering the circuit member 18 to the substrate 12. The adhesive 22 includes a resin having about forty to fifty percent by weight conductive metal between the vertically aligned terminals 20 and conductive paths 16 and the resin is conductive vertically or uniaxially therebetween. The adhesive 22 includes about twenty to twenty-five percent by weight conductive metal between laterally spaced terminals 20 or conductive paths 16 and the resin is therefore nonconductive laterally therebetween. The lower percentage of metal filler in the adhesive 22 is not sufficient to support electrical current flow through the resin.

The adhesive 22 includes conductive metal particles in powder form or the alloy of the conductive metal particles in powder form. Conductive metals may be selected from the group including nickel, silver, graphite, palladium, platinum, gold, chromium, aluminum, cadmium, cobalt, copper, iron, indium, iridium, magnesium, molybdenum, tin, tungsten, zinc, gallium, germanium, and antimony and other conductive materials. The metal powder may have a size of 0.8 microns to 40 microns. Preferably, the metal powder includes particles having an average size of 0.8 to 7 microns. Said another way, in the preferred range the largest particle may be at least eight (8) times larger than the smallest with an array of different sizes therebetween. The size of the particles may be determined by the size of the components adhered together, larger components can be spaced further apart thereby allowing for larger size particles to be used.

The adhesive further includes a polymerized resin in its pure form or as a mixture of several types of resins. The resin may be selected from the group including epoxy resins and modified resins with hardeners, acrylic resins and modified acrylic resins, polyester and modified polymers thereof, acrylic ester resins and modified ester resins thereof, silicone resins, phenoxy resins, polyurethane resins, polysulfide, cyanoacrylates, polyalexins, UV-curable polymers, and other well known adhesive resins. The resins are generally considered nonconductive in the polymerized state. However, pursuant to the subject invention, the resin is made conductive by the step of concentrating the metal powder mixed therein to between forty to fifty percent by weight.

Figure 6:
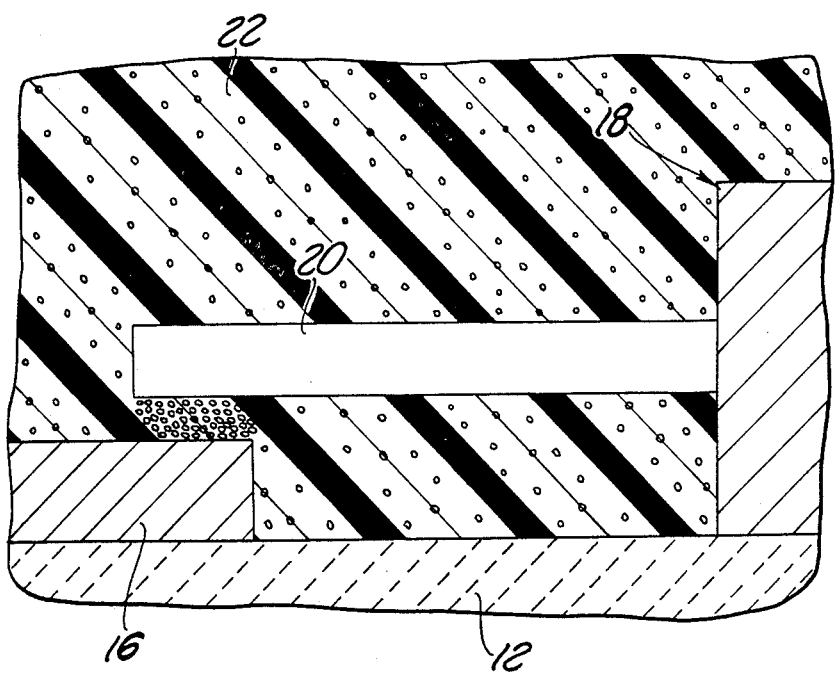
FIG. 6 is an enlarged view of the connection between the condu tive terminal and the conductive path by the subject adhesive.

The resin is a dielectric preventing conductivity between spaced metal particles therein. As shown in FIG. 6, the percent by weight content of the metal particles in the resin is concentrated between the conductive terminals 20 and conductive paths 16 thereby decreasing the spacing between the metal particles. The decreased spacing allows conductivity through the resin providing conductivity between the aligned conductive terminals 20 and conductive paths 16. THe metal particles suspended in the resin between laterally sapced conductive terminals 20 and conductive paths 16 are not concentrated. The resin prevents conductivity between spaced metal particles. The effect achieved is uniaxial conductivity between aligned conductive members 16,20 and insulation or nonconductivity therebetween.

The terminal members 20 may be substantially rigid pins 20 extending laterally from the circuit member 18. Preferably, the distance between the conductive terminals 20 and the mounting surface 14 is less than or equal to 20 microns. However, the terminal members 20 are often not coplanar as they extend from a circuit member 18. Hence, the distance between the terminal members 20 and the mounting surface 14 of the substrate 12 may vary. The terminal members 20 may take other forms and hardness. The example, the terminal members 20 may be flexible foil projection extending from the circuit member 18. Alternatively, the terminal members 20 may be rigid members mounted directly on the body of the circuit member 18.

The instant invention includes a method of connecting the circuit member 18 having the plurality of laterally spaced conductive terminals 20 to the substrate 12 which having the mounting surface 14 presenting the plurality of laterally spaced conductive paths 16 thereon. The method includes the steps of applying the adhesive 22 including the resin having a twenty to twenty-five percent by weight content of the conductive metal particles over the mounting surface 14 of the substrate 12 having the conductive paths 16. Preferably, the adhesive is applied in a layer greater than 20 microns over the entire surface, i.e., the conductive and nonconductive portions to an even upper surface. Alternatively, the adhesive may be applied in an amount so as to secure the circuit member 18 to the substrate or in an amount covering all electrical components and thereby providing an effective environmental seal.

The circuit member 18 is mounted on the adhesive 22 while vertically aligning the conductive terminals 20 over preselected ones of the conductive paths 16. The method is characterized by the step of concentrating the percent by weight content of the conductive metal particles in the adhesive 22 between each conductive terminal 20 and the vertically aligned conductive paths 16 to between forty to fifty percent by weight to decrease the spacing between the metal particles and make the resin conductive vertically therebetween while the resin in the unconcentrated adhesive remains nonconductive between laterally spaced terminals 20 and conductive paths 16. In other words, if the metal in the cured adhesive 22 between the conductive terminals 20 and the conductive paths 16 is increased or concentrated from between twenty and twenty-five percent to between forty and fifty percent by weight, there is conductivity in these concentrated regions and no conductivity in the unconcentrated regions therebetween. Hence, the instant method affectively provides a uniaxially conductive adhesive which is conductive between aligned conductive terminals 20 and conductive paths 16 but is nonconductive between laterally spaced terminals 20 and conductive paths 16.

The concentration of metal in the adhesive may be concentrated by applying pressure between the terminal 20 and the vertically aligned conductive path 16 to concentrate the conductive metal therebetween. Such application of pressure effective forces nonplanar terminal member in coplanarity. As illustrated in FIG. 3, a pressure applying member 24 can be used to apply pressure against the circuit member 18 thereby effectively applying pressure between the terminal member 20 and conductive path 16 as the two are moved together. Such pressure concentrates the metal in the adhesive 22 between the conductive paths 16 and terminal member 20 while not concentrating the adhesive between laterally spaced terminals 20 and conductive path 16. When the terminal members 20 are substantially rigid pins 20 extending from the circuit member 18, the concentrating step may be defined as applying pressure on the circuit member 18 against the substrate 12. Preferably, pressure may be applied from three to forty pounds per square inch dependent upon the size of the circuit member 18 and/or terminal sizes. The conductive terminal 20 is preferably moved to within 20 microns or less of the substrate 14. Each of these preferred values may vary as the terminal members are generally not coplanar as they extend from the circuit member 18. Hence, the adhesive 22 must be concentrated into the preferred range of forty to fifty percent metal content at each terminal member 20 for complete conductivity. If the terminal members 20 are flexible, the pressure need be applied directly to the terminal members 20.

The adhesive 22 is cured at a predetermined time and temperature as the pressure is applied, i.e., a holding force maintains each terminal member 20 in predetermined closely spaced relationship to its associated conductive path 16. Generally, the adhesive 22 may be cured at room temperature to 250° C. for a period of a few seconds to one hour, these values being dependent upon the adhesive used.

When the adhesive 22 is an ultraviolet curable adhesive, the curing step is accomplished by irradiating the adhesive 22 under an ultraviolet lamp for a predetermined amount of time.

Although the pressure may be varied dependent upon the size of the circuit member 18 being used, preferably, ounces to ten pounds of pressure per square inch is applied dependent upon the size of the component and/or structural characteristics of the terminals.

Initially, the adhesive 22 is prepared by mixing an adhesive resin and a metal powder together uniformly to suspend the metal powder within the adhesive. The adhesive is brought to a preferred viscosity, preferably between the range of 10,000 to 40,000 CPS. Most preferably, the viscosity of the adhesive mixture is between 15,000 to 20,000 CPS. The viscosity values may be varied dependent upon the nature of the metal powder, the viscosity determining the ability of the adhesive 22 to suspend the metal in a uniform mixture.

The instant invention provides an adhesive 22 for connecting the circuit member 18 having the plurality of laterally spaced conductive terminals 20 to the substrate 12 including the mounting surface 14 having the plurality of laterally spaced conductive paths 16. The adhesive 22 includes a mixture of the polymeric resin and twenty to twenty-five percent by weight of a pure conductive metal powder or alloy thereof uniformly suspended in the resin as a resin/metal suspension. The adhesive 22 is characterized by the resin being nonconductive as the resin/metal suspension and the resin being conductive when concentrated to included forty to fifty percent by weight of the metal.

The subject adhesive can be used in a variety of environments. The adhesive can be characterized as a metal to metal adhesive for bonding a conductive terminal to a conductive path on a substrate. In addition, the adhesive can adhere a circuit member to a substrate board. With electronic assemblies, the adhesive can be used to adhere components to substrates whereby component terminations are electrically connected to substrate conductive paths such as printed wiring thereby replacing all soldering techniques. The adhesive can be used in surface mount technology, with printed wiring boards or printed circuit boards. Additionally, the adhesive may be used in conventional through hole techniques, hybrid technology, flip chip or chip on board technology, with tape automated bonding or pin grid arrays wherein chips (integrated circuits) are adhered to arrays and arrays to printed wiring boards.

The adhesive can also be used to replace omnidirectional conductive adhesives which previously have required insulative material between conductors. The adhesive can be used for substrate to substrate attachment such as with flexible printed wiring boards to rigid wiring boards, flexible wiring boards to flexible wiring boards and rigid printed wiring boards to rigid wiring boards, etc. The adhesive can be use with cable (wire) to substrate attachments, such as with flat flexible cable, flat ribbon cable, round wire cable and other forms of cable. The adhesive may be used in connector applications to improve reliability wherein wire cable is connected to other attachments such as insulation displacement connectors sealing, connector to connector attachment and sealing, and connector to printed circuit boards.

Another area where the adhesive may be used is with component fabrication. Examples of such uses are with semiconductors to lead frame (conductor) attachments such as integrated circuits, transistors and diodes. Lid sealing of certain integrated circuits can also be accomplished. The adhesive replaces other bonding techniques such as thermal compression, ultrasonic compression and other methods previously being used. Passive elements such as capacitors and resistors may also be connected to leads.

The subject adhesive can be used in electromagnets interference (EMI) and radio frequency interference (EFI) sealing techniques such as lid sealing.

The subject adhesive further provides utility in the repair of substrate conductor traces.

In general, the subject adhesive may be used as a general adhesive for electrical device connection to various other devices.

The instant invention provides several significant advantages over prior art adhesives. As the subject adhesive may be cured at room temperature or at least at lower temperatures than prior art soldering techniques, various substrate materials heretofore not usable can be utilized. Nonceramic substrates which need not withstand the high temperature environment of solder may be utilized thereby lowering the expense of completed circuits.

The subject adhesive further provides a coating over the component parts effecting an environmental seal.

Soldering, is a specific method, providing specific problems. The application of solder only bonds where the solder was applied and was conductive at those points. The instant invention provides an adhesive material for the entire substrate surface as well as over components mounted thereon, yet provides conductivity only where desired. The instant invention further eliminates the cleaning required in prior art soldering techniques. Such cleaning requires the exposure of the circuit board to harsh chemicals not required by the instant invention. Solder mask can also eliminated.

The instant invention does not exhibit migration or electrolysis found in prior art techniques. The instant invention further eliminates coatings on copper printed circuits previously required such as tin plating or seal bright.

In general, an advantage of the instant invention is that the adhesive no longer becomes a limiting factor in choosing substrates. Additionally, uniaxial conductivity can be obtained with extremely close lateral spacing of conductors.

A first embodiment of the inventor was made to include mixture of 10 grams of EPIC R1003, modified epoxy resin, sold by Epic Resins, a division of RTE Corporation, 1900 East North Street, Waukesh, Wis. 53186, and 5 grams of EPIC H5002 modified aliphatic amine (epoxy resin hardener), also sold by Epic Resins, added at room temperature to 3.75 grams of 99.8% nickel powder, 0.8 u as measured by Fisher subsieve, sold by Aldrich Chemical Co., 940 West Saint Paul Ave., Milwaukee, Wis. 53133. The chemicals are mixed well until a uniform mixture is obtained. The viscosity of the mixture was about 15,000 cps, so that the epoxy resin held the nickel powder in suspension.

The epoxy resin and nickel powder mixture was uniformly coated on a PC board (made by 3M, vapor phase, reflow solding fluorinet liquids FC-70/FC-71), at a thickness of 80 $\mu$m. A digital (integrated circuit), (M1511D5 with 14 pins), was placed on the glue coated PC board. The digital integrated circuit's pins were correspondingly matched to the metal strips on the PC board. The spacing between substrate conductive paths was 500 $\mu$m. About 4 pounds of pressure was placed on the digital integrated circuit for 15 minutes and at 150° C. in order to complete cure.

After cure, conductivity between pins (laterally) was greater then $10^{13}$ ohms (not conductive) yet the conductivity between pins and corresponding metal strips on the PC board was $10^{-3}$ ohms (excellent conductivity).

A second embodiment of the invention was made wherein 10 grams of Epic S7020A, from Epic Resins, epoxy resin diglycidyl ether of bisphenol A, 5 grams Epic S7020B, from Epic Resins, modified amine, and 3.75 grams nickel powder, INCO type 123, 3–7 $\mu$m, sold by The International Nickel Company, Inc. were mixed to a uniform suspension having a viscosity between 20,000 to 22,000 cps. A digital integrated circuit was mounted on a PC board as in the first embodiment of the invention. A pressure of 4 pounds was applied to the circuits and curing was effected at a temperature of 130° C. for 15 minutes. Excellent vertical conductivity was obtained with effectively no lateral conductivity.

A third example of the invention includes 10 grams of Norbak 179-60, which is a single component, solvent-free epoxy resin, sold by Rexnord Chemical Products, Inc., Resin, Systems, 6120 E 58th Avenue, Commerce City, Colo., mixed with 2 grams of INCO type 123 Nickel powder, size and 0.5 gram of No. 4739 graphite, 5 $\mu$m powder, so by Superior Graphite Co., 120 South Riverside Place, Chicago, Ill. 60606, to a uniform suspension having a viscosity of 20,000–25,000 cps. A digital integrated circuit was mounted on a PC board as in the first embodiment previously discussed. A pressure of 4 pounds was applied to the circuit and curing was effected at a temperature of 150° C. 15 minutes. Conductivity and insulation resistance are shown graphically in FIGS. 4 and 5.

Figure 4:
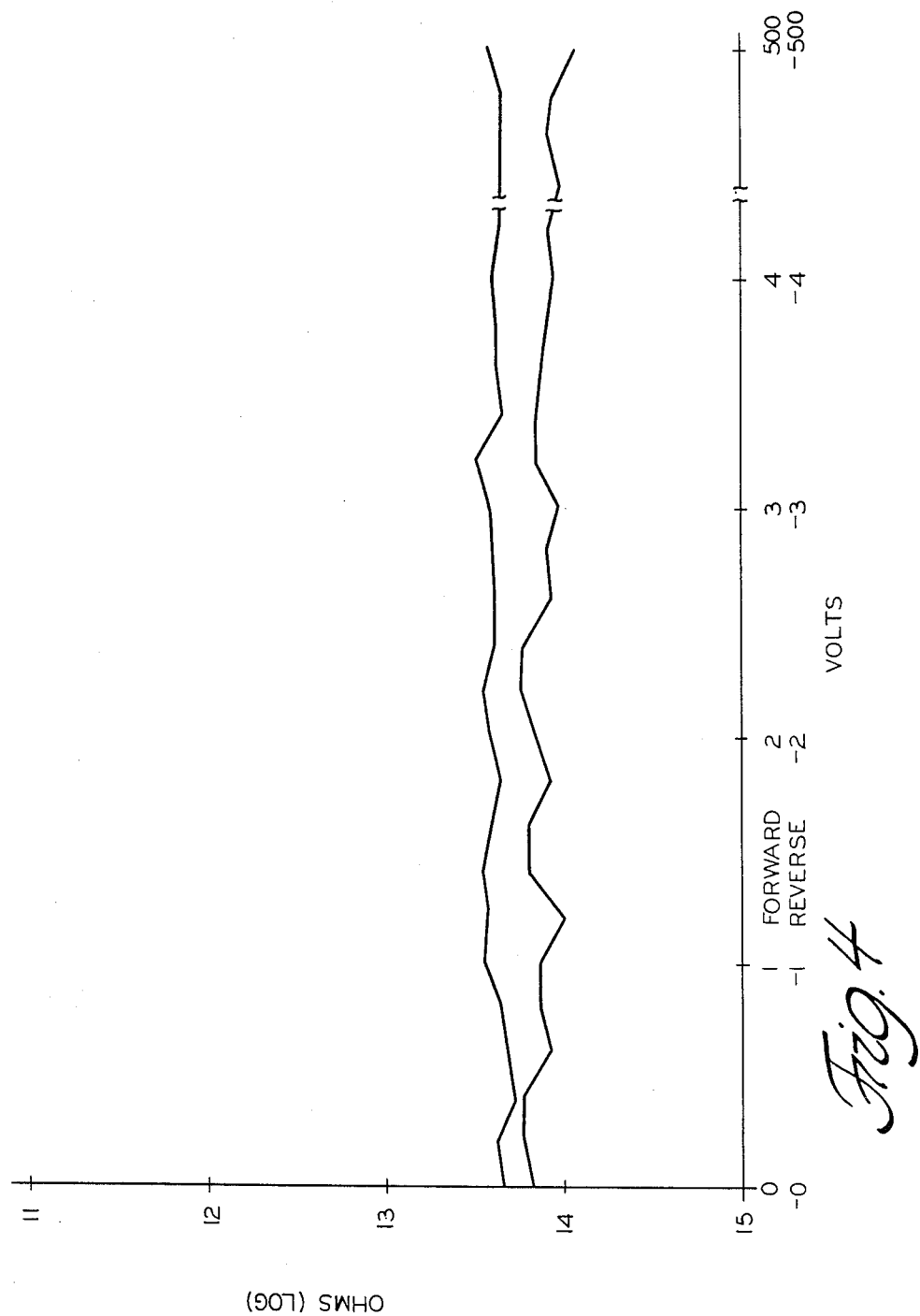
FIG. 4 is a graph of current versus voltage showing insulation resistance of the subject adhesive between laterally spaced terminals.

FIG. 4 illustrates insulating resistance of the adhesive laterally between terminals over a range of voltage (forward and reverse polarity). No breakdown of insulation occurred over the tested voltage range.

Figure 5:
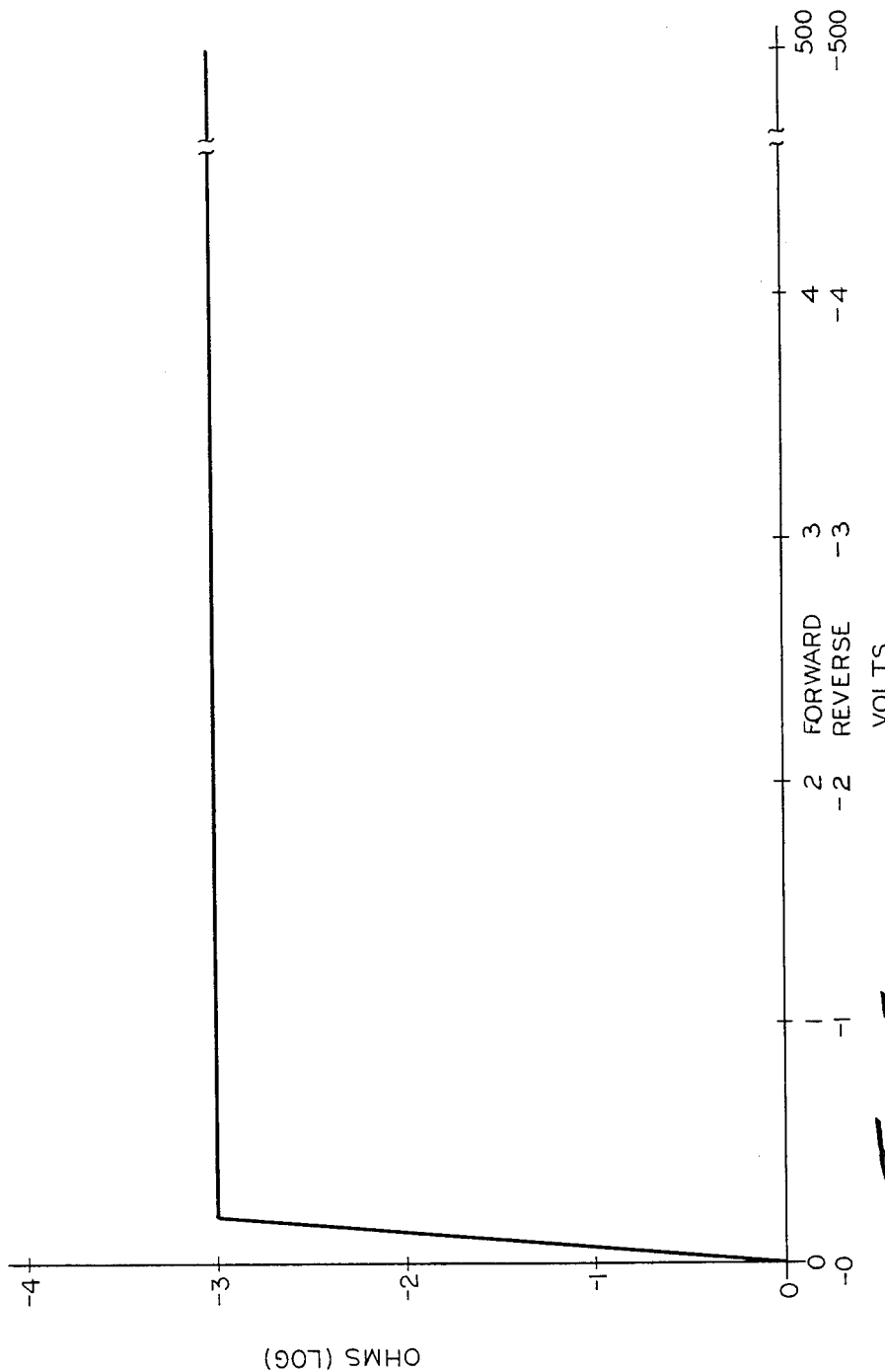
FIG. 5 is a graph of current versus voltage showing conductivity between aligned terminal members and conductive substrate paths.

FIG. 5 illustrates conductivity between the terminal pins and conductive metal of the PC board. Beyond the threshold voltage, current was conducted and constant over the tested voltage range.

In combination, FIGS. 4 and 5 show good uniaxial conductivity in the vertical direction with effective insulation in the lateral direction over a wide test range.

Another embodiment of the invention includes 5 grams EJN-002, UV dielectric coating, sold by Polytronix Inc., P.O. Box 3024, Richardson, Tex. 75080 mixed with 1 gram silver powder 2.0–3.5 $\mu$of the substrate 14. Each of these m, sold by Alfa Product, Thiako/Ventron Division, P.O. Box 299, 152 Andover Street, Danvers, Mass. 01923.

0.3 grams 5 $\mu$Superior Graphite Co., was added to the mixture as a uniform suspension having a viscosity of 18,000 cps. The circuit was mounted on the PC board as in the first embodiment. 4 pounds of pressure was applied to the circuit for 5 minutes under UV-light by a Blak-ray, longwave UV lamp. Mode B-100A made by Ultra-Violet Product, Inc., San Gabriel, Calif. The adhesive provided excellent conductivity in the vertical direction and excellent lateral insulation.

In another formulation, a mixture of 10 grams of Epic R1003, modified epoxy resin sold by Epic Resins, a division of RTE Corporation, 1900 East North Street, Waukesha, Wis. 53186 and 5 grams of EPC H5002, modified aliphatic amine as hardener, also sold by Epic Resins, at room temperature, was added in varying amounts of 99.8% Nickel powder (less than 0.8 μ by Fisher subsieve), sold by Aldrich Chemical Co., 940 West Saint Paul Ave., Milwaukee, Wis. 53233. The mixture was mixed well until uniform.

This epoxy resin and nickel powder mixture was uniformly coated on a PC board, sold by 3M. The thickness is about 20 μm after heating 150° C. for 15 minutes while applying pressure. Conductivity from terminal to substrate was then determined. The results are shown in Table I.

TABLE I

| Amount of Nickel Powder (Percent by weight) | Conductivity (ohm) |
|---|---|
| 20 | $>10^{14}$ |
| 25 | $>10^{14}$ |
| 30 | $>10^{14}$ |
| 35 | $>10^{13}$ ($4.3 \times 10^{13}$) |
| 40 | $1.8 \times 10^{6}$ |
| 45 | $3.7 \times 10^{-1}$ |
| 50 | $1.26 \times 10^{-3}$ |
| 55 | $<10^{-3}$ |
| 60 | $<10^{-3}$ |

The same procedure as set forth previously was utilized to make and test the adhesive except that the digital integrated circuit was pressed with varying pressure. The adhesive was cured at 150° C. for 15 minutes. At that time, the distance between the PC board and conductivity between the conductive terminal and substrate was measured. The results are shown in Table II.

TABLE II

| Applied Pressure (PSI) | Distance Between PC Board/ IC (um) | Conductivity (ohm) |
|---|---|---|
| 0 | 38 | $>10^{14}$ |
| 0.5 | 36 | $>10^{14}$ |
| 1 | 31 | $2.7 \times 10^{3}$ |
| 3 | 28 | $4.3 \times 10^{-1}$ |
| 3.5 | 26 | $1.8 \times 10^{-2}$ |
| 4 | 23 | $1.1 \times 10^{-3}$ |
| 6 | 21 | $<10^{-3}$ |
| 10 | 16 | $<10^{-3}$ |
| 20 | 13 | $<10^{-3}$ |
| 40 | 12 | $<10^{-3}$ |

The aforementioned formulation show that there is effective insulation resistance between laterally spaced terminal members and conductive paths (FIG. 4) while there is excellent conductivity between aligned terminal members and conductive paths (FIG. 5). Such conductivity and insulation is exhibited over a wide range of voltages showing the instant invention to be applicable in various environments and for various uses. Table I illustrates the relationship between metal powder content and conductivity, showing good conductivity beginning at about forty percent metal content. Table II illustrates varying amounts of applied pressure as well as preferred distances between terminal and substrate to provide good conductivity.

The invention has been described in an illustrative manner, and it is to be understood that the terminology which has been used is intended to be in the nature of words of description rather than of limitation.

Obviously, many modifications and variations of the present invention are possible in light of the above teachings. It is, therefore, to be understood that within the scope of the appended claims the invention may be practiced otherwise than as specifically described.

What is claimed is:

1. An adhesive (22) for connecting a circuit member (18) having a plurality of laterally spaced conductive terminals (20) to a substrate (12) including a mounting surface (14) having a plurality of laterally spaced conductive paths (16), said adhesive (22) comprising a mixture of dielectric polymeric resin having a viscosity of 10,000 cps to 40,000 cps and twenty to twenty-five percent by weight of spaced pure conductive metal particles of any alloy thereof uniformly suspended in said resin as a resin/metal suspension wherein said resin prevents conductivity between said spaced metal particles, said adhesive (22) characterized by said resin being nonconductive as said resin/metal suspension and being conductive when concentrated in response to the application of pressure to decrease the amount of spacing between said spaced metal particles while said metal particles remain spaced by said viscosity of said resin allowing conductivity through said resin when said resin is concentrated to include forty to fifty perecent by weight of said metal.

2. An adhesive as set forth in claim 1 wherein said resin includes a conductive metal selected from the group including nickel, silver, graphite, palladium, platium, gold, chromium, aluminum, cadmium, cobalt, copper, iron, indium, iridium, magnesium, molybdenum, tin, tungsten, zinc, gallium, germanium, and antimony.

3. An adhesive as set forth in claim 2 wherein said metal is a powder having particles with an average size of from 0.8 μm to 40 μm.

4. An adhesive as set forth in claim 3 wherein said metal powder includes particles having an average size of 0.8 to 7 μm.

5. An adhesive as set forth in claim 1 wherein said polymerized resin selected from the group including epoxy resin and its modified resins, polyester and its modified polymers, acrylic ester resin and its modified esters, silicone resins, phenoxy resins, polyurethane, polysulfide, cyanoacrylates, polyalexins, and UV-curable polymers.

6. An adhesive (22) for connecting a circuit member (18) having a plurality of laterally spaced conductive terminals (20) to a substrate (12) including a mounting surface (14) having a plurality of laterally spaced conductive paths (16), said adhesive (22) comprising: said adhesive (22) comprising a mixture of dielectric polymeric resin having a viscosity of 10,000 cps to 40,000 cps and twenty to twenty-five percent by weight of spaced pure conductive metal particles or any alloy thereof uniformly suspended in said resin as a resin/metal suspension wherein said resin prevents conductivity between said spaced metal particles, said resin being nonconductive as said resin/metal suspension and being conductive when concentrated in response to the application of pressure to decrease the amount of spacing between said spaced metal particles while said metal particles remain spaced by said viscosity of said resin allowing conductivity through said resin when said resin is concentrated to include forty to fifty percent by weight of said metal 25% by weight metal content between said laterally spaced terminals (20) and conductive paths (16).

* * * * *